United States Patent
Malshe et al.

(10) Patent No.: US 10,283,205 B2
(45) Date of Patent: May 7, 2019

(54) PREEMPTIVE IDLE TIME READ SCANS

(71) Applicant: Micron Technology, Inc., Boise, ID (US)

(72) Inventors: Ashutosh Malshe, Fremont, CA (US); Harish Singidi, Fremont, CA (US); Kishore Kumar Muchherla, Fremont, CA (US); Michael G. Miller, Boise, ID (US); Sampath Ratnam, Boise, ID (US); John Zhang, Shanghai (CN); Jie Zhou, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/571,232

(22) PCT Filed: Sep. 30, 2017

(86) PCT No.: PCT/CN2017/104945
§ 371 (c)(1),
(2) Date: Nov. 1, 2017

(65) Prior Publication Data
US 2019/0103164 A1    Apr. 4, 2019

(51) Int. Cl.
*G06F 12/00* (2006.01)
*G11C 16/26* (2006.01)
(Continued)

(52) U.S. Cl.
CPC ............ *G11C 16/26* (2013.01); *G06F 11/076* (2013.01); *G06F 11/22* (2013.01);
(Continued)

(58) Field of Classification Search
None
See application file for complete search history.

(56) References Cited

U.S. PATENT DOCUMENTS 8,700,840 B2    4/2014   Paley et al.
2006/0233010 A1  10/2006  Li
(Continued)

FOREIGN PATENT DOCUMENTS

CN    101699413 A    4/2010

OTHER PUBLICATIONS

"International Application Serial No. PCT/CN2017/104945, International Search Report dated Jun. 27, 2018", 4 pgs.
(Continued)

*Primary Examiner* — Daniel D Tsui
(74) *Attorney, Agent, or Firm* — Schwegman Lundberg & Woessner, P.A.

(57) ABSTRACT

Devices and techniques for initiating and controlling preemptive idle time read scans in a flash based storage system are disclosed. In an example, a memory device includes a NAND memory array and a memory controller to schedule and initiate read scans among multiple locations of the memory array, with such read scans being preemptively triggered during an idle (background) state of the memory device, thus reducing host latency during read and write operations in an active (foreground) state of the memory device. In an example, the optimization technique includes scheduling a read scan operation, monitoring an active or idle state of host IO operations, and preemptively initiating the read scan operation when entering an idle state, before the read scan operation is scheduled to occur. In further examples, the read scan may preemptively occur based on time-based scheduling, frequency-based conditions, or event-driven conditions triggering the read scan.

31 Claims, 9 Drawing Sheets

(51) Int. Cl.
  *G06F 12/02*  (2006.01)
  *G06F 11/07*  (2006.01)
  *G11C 7/06*  (2006.01)
  *G11C 16/34*  (2006.01)
  *G06F 11/22*  (2006.01)

(52) U.S. Cl.
  CPC ............ *G06F 12/0246* (2013.01); *G11C 7/06* (2013.01); *G11C 16/3436* (2013.01); *G06F 2212/7211* (2013.01); *G11C 2207/2254* (2013.01)

(56) References Cited

U.S. PATENT DOCUMENTS

| | | | |
|---|---|---|---|
| 2008/0104387 A1* | 5/2008 | Owhadi | G06F 11/2221 713/2 |
| 2009/0327581 A1 | 12/2009 | Coulson | |
| 2010/0115345 A1* | 5/2010 | Childs | G06F 11/2221 714/42 |
| 2012/0163097 A1 | 6/2012 | Ishikawa et al. | |
| 2013/0055046 A1 | 2/2013 | Blodgett | |
| 2014/0075105 A1 | 3/2014 | Colgrove et al. | |
| 2014/0347923 A1* | 11/2014 | Ghaly | G11C 16/3404 365/185.03 |
| 2015/0006983 A1* | 1/2015 | Lin | G11C 29/50004 714/721 |
| 2015/0117107 A1 | 4/2015 | Sun et al. | |
| 2015/0127883 A1 | 5/2015 | Chen et al. | |
| 2015/0262714 A1 | 9/2015 | Tuers et al. | |
| 2016/0117216 A1 | 4/2016 | Muchherla et al. | |

OTHER PUBLICATIONS

"International Application Serial No. PCT/CN2017/104945, Written Opinion dated Jun. 27, 2018", 4 pgs.

* cited by examiner

PREEMPTIVE IDLE TIME READ SCANS

PRIORITY APPLICATION

This application is a U.S. National Stage Application under 35 U.S.C. 371 from International Application No. PCT/CN2017/104945, filed Sep. 30, 2017, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

In NAND flash based storage systems, the read voltage threshold (Vt) that is required to successfully perform read operations is constantly subjected to shifts. These shifts may occur due to well-known stresses on the NAND flash such as Read Disturb, Data Retention, Cross-temperature effect, among other conditions. Further, different NAND blocks within a memory array may experience a varying amount of stress that induces a varying amount of charge loss or charge gain; likewise, different NAND blocks of a memory array are often written and read at different temperatures. As a result, a mismatch between the NAND Vt and the read voltage actually used by a storage system occur in many scenarios, and techniques for read voltage calibration are used by NAND storage systems to adjust the read voltage in accordance with NAND Vt.

Existing approaches for tracking the NAND health and the corresponding Vt changes include tracking a raw bit error rate (RBER) trend, such as a RBER trend determined from reading pages in NAND blocks with a read scan. The objective of performing read scans is to provide real time NAND RBER feedback, such that the system can optimally calibrate NAND read voltages to minimize error handling trigger rate, or initiate pre-emptive action to mitigate data integrity risk induced by various stress factors in the NAND blocks. However, performing read scans often imposes a performance overhead for the storage system, and increases host command latency.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The systems, processes, and configurations discussed herein relate to optimization techniques for triggering and performing preemptive idle time read scans in a NAND memory device. Specifically, example techniques are disclosed that use window-based criteria, instead of absolute criteria, to preemptively trigger read scans when applicable during idle states of host read/write drive activity. The performance of read scans during such idle states may reduce the impact of read scans on host read/write performance. Further, example techniques are disclosed that enable the window-based trigger criteria to be used in response to time triggers, frequency-based triggers, or event-based triggers. Still further, the preemptive read scan triggers may be used to provide a memory system with the opportunity to perform additional maintenance tasks in the background during idle states, thus alleviating the host IO performance impact of conducting such maintenance tasks in the foreground.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

Figure 1:
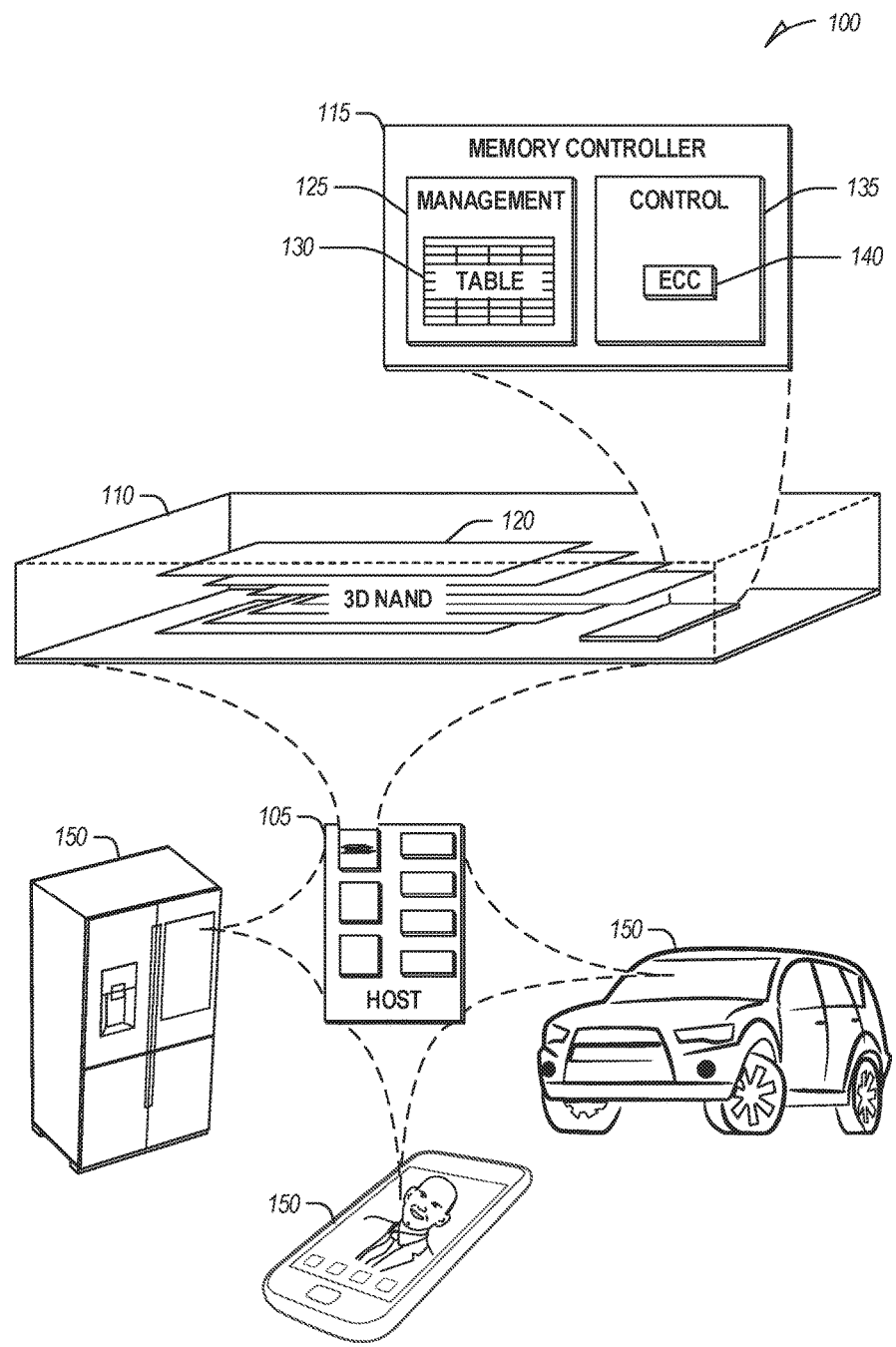
FIG. 1 illustrates an example of an environment including a memory device.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 800 of FIG. 8.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
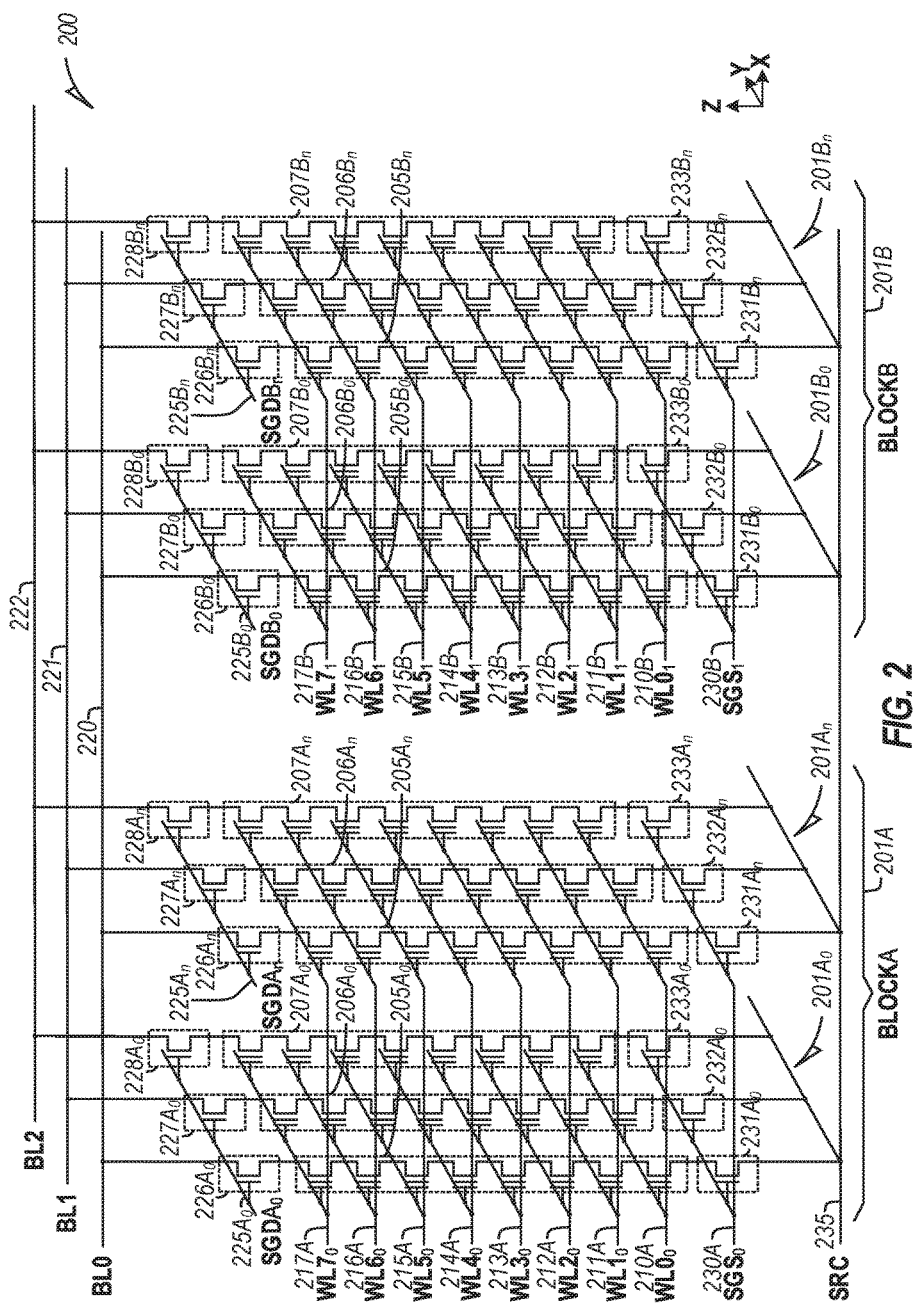
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings 205$A_0$-207$A_0$, first-third $A_n$ memory strings 205$A_n$-207$A_n$, first-third $B_0$ memory strings 205$B_0$-207$B_0$, first-third $B_n$ memory strings 205$B_n$-207$B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231$A_0$-233$A_0$, first-third $A_n$ SGS 231$A_n$-233$A_n$, first-third $B_0$ SGS 231$B_0$-233$B_0$, first-third $B_n$ SGS 231$B_n$-233$B_n$, etc.) and a drain-side select gate (SGD) (e.g., first-third $A_0$ SGD 226$A_0$-228$A_0$, first-third $A_n$ SGD 226$A_n$-228$A_n$, first-third $B_0$ SGD 226$B_0$-228$B_0$, first-third $B_n$ SGD 226$B_n$-228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 226$A_0$-228$A_0$ can be accessed using an $A_0$ SGD line SGD$A_0$ 225$A_0$, first-third $A_n$ SGD 226$A_n$-228$A_n$ can be accessed using an $A_n$ SGD line SGD$_A$ 225$A_n$, first-third $B_0$ SGD 226$B_0$-228$B_0$ can be accessed using an $B_0$ SGD line SGD$B_0$ 225B, and first-third $B_n$ SGD 226$B_n$-228$B_n$ can be accessed using an $B_n$ SGD line SGD$B_n$ 225$B_n$. First-third $A_0$ SGS 231$A_0$-233$A_0$ and first-third $A_n$ SGS 231A-233$A_n$ can be accessed using a gate select line $SGS_0$ 230A, and first-third $B_0$ SGS 231$B_0$-233$B_0$ and first-third $B_n$ SGS 231$B_n$-233$B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
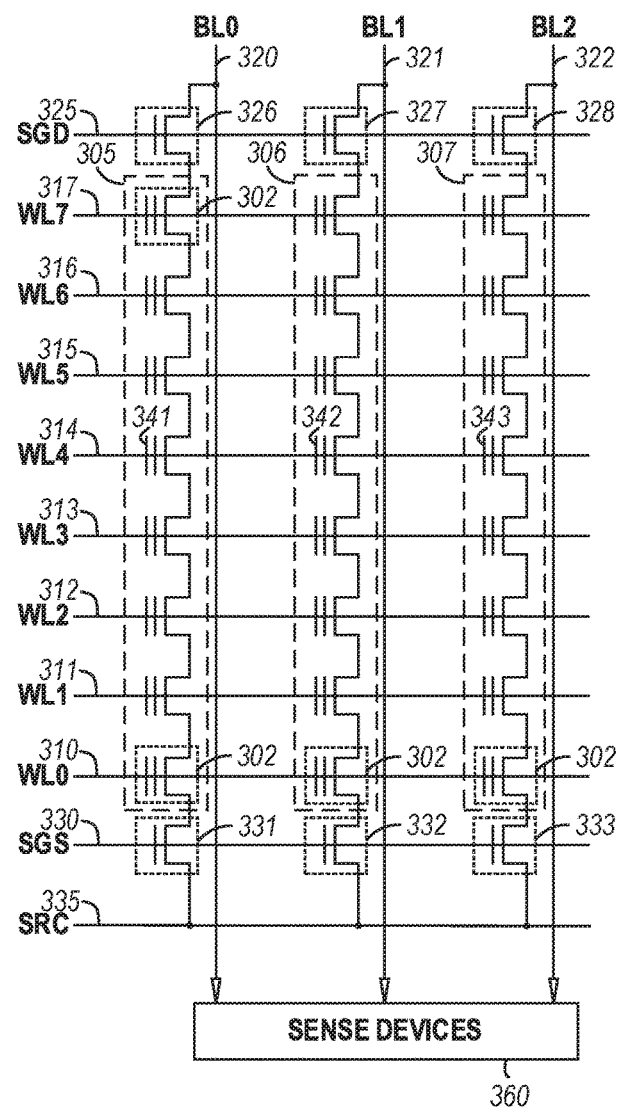

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied 20 to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
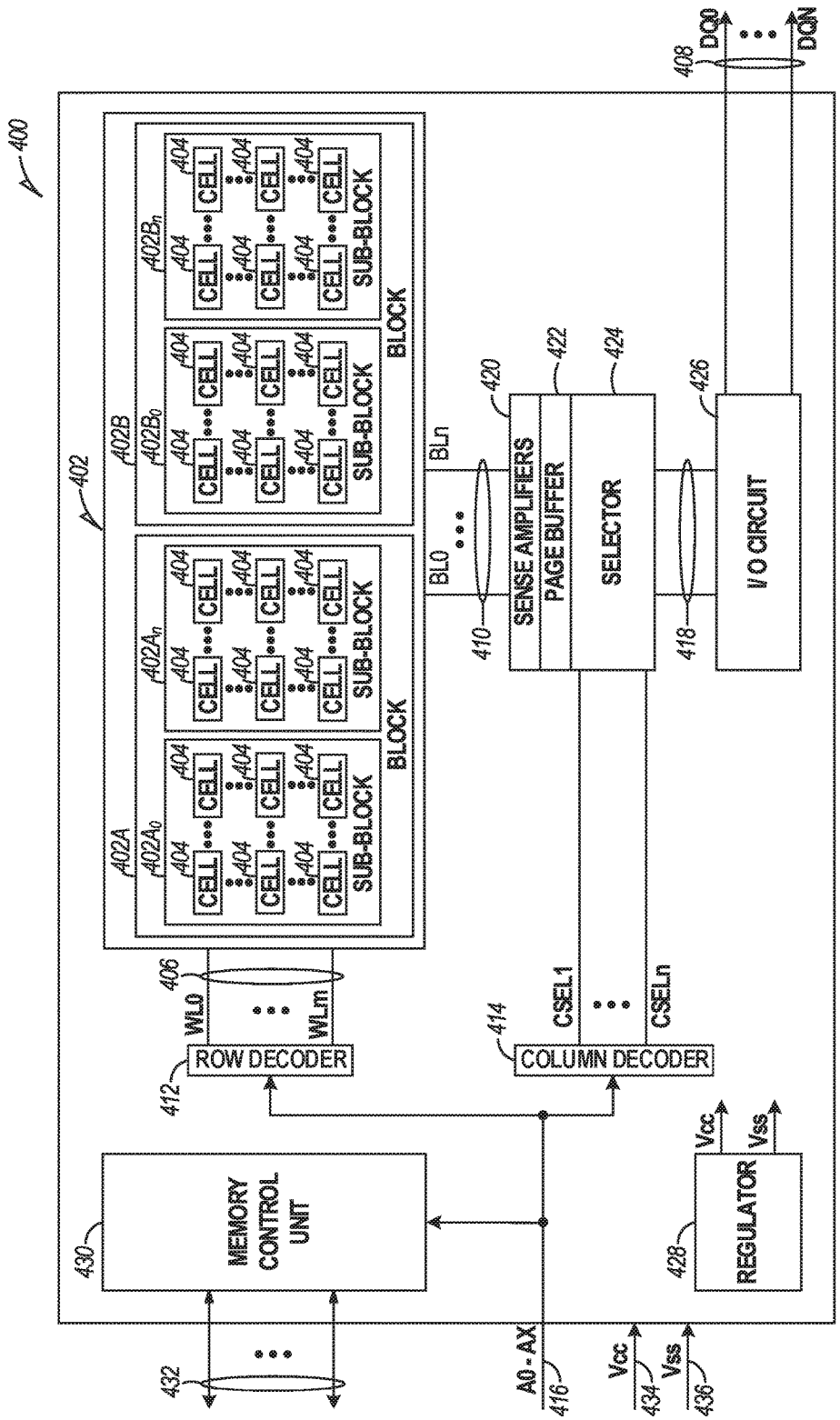
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

The following techniques and configurations provide techniques implemented within a NAND memory device for aspects of read scan optimization, including scheduling, triggering, and control of such read scan operations. The techniques and configurations discussed herein may be specifically applicable to a 3D NAND flash based storage system, such as a system embodying the 3D NAND architecture features discussed above. However, it will be apparent that the disclosed read scan optimization techniques and configurations may also apply to other forms of NAND flash devices, including with components of NAND flash devices applied in other form factors or arrangements.

In NAND flash based storage systems, a NAND memory array includes various blocks that experience different amount of charge loss and charge gain, and various blocks that are programmed (written) at different temperatures. Thus, the Vt to read any particular block or area of the memory array may vary from another block or another area of the memory array. Further, the Vt for a particular block or area of memory is constantly subjected to shifts due to stresses, and as a result, Vt may shift in either direction.

Read disturb is an example of a stress occurring on a NAND flash device that affects Vt. As a host or application retrieves certain data from the flash device, the read disturb stress may build up if the host utilizes a particularly high read rate or read intensive application of data (depending on how the data is scattered within the flash device). For instance, if a logical block address (LBA) maps to a particular physical location of a NAND block, because of the biasing condition within the block, stresses may be induced on the unselected word lines that cause the Vt of the memory cells to shift.

Cross-temperature effect is another example of a stress occurring on a NAND flash device that affects Vt. Cross-temperature effect causes a shift in the cell Vt in the NAND blocks, to the right or left, as a result of a temperature difference between the time of writing and the time of reading. For instance, as data is written to a NAND flash device (e.g., a SSD drive, or SD/MMC card), the Vt needed to read the data is based on the ambient temperature when the data was is written. However, because the data may remain resident on the flash device for long period of time, the flash device is less likely to be read at the same temperature.

A mismatch between a read voltage used to read a block and the Vt for a particular block will result in data errors. One representation of data errors, the fail bit count, may be measured in a NAND storage system as a "raw bit error rate" (RBER). As a result, RBER provides a function of the mismatch between the read voltage and the Vt. Thus, in the operation of many existing NAND flash-based storage systems, the RBER provides a measurement to determine whether read voltage is incorrect, and whether voltage calibration should be conducted.

NAND health, as indicated by a trend or measurement of RBER, can be tracked by reading pages from various blocks of the NAND memory array. This technique for reading pages is commonly referred to as a "read scan", and involves reading a random or determined set of sampled pages or word lines at different read voltages across NAND blocks. In existing memory devices, a read scan may be triggered at a regular cadence from synchronous events to track time-dependent stress effects such as data retention; or, a read scan may be triggered based on block usage or host workload pattern from asynchronous events, such as in case of read disturb.

The primary objective of read scans is to provide real time NAND RBER feedback, such that the memory device determines when to calibrate NAND read voltages to minimize error handling trigger rate, or when to initiate preemptive action to mitigate data integrity risk induced by various stress factors in the NAND blocks. With existing forms of read scan processes, sampling the RBER at different read voltages impacts host performance and increases command latency. Thus, the sampling used by existing forms of read scan processes is often performed at a slow enough rate so that the host performance is not impacted.

Techniques and configurations are discussed herein to improve the system performance by coordinating with scheduled conditions, such as time window-based, frequency-based, or event-based conditions, to pre-emptively trigger read scans during host IO idle time. This provides an opportunity for a memory system to reduce host IO contentions in the foreground based on absolute triggers of the scheduled conditions, and thus improve performance and reduce latency for host operations under benchmark workloads and typical user workloads.

The techniques discussed herein include the use of window-based criteria in lieu of absolute criteria to preemptively trigger read scans in idle periods of memory device activity. In particular, memory devices used in mobile devices and consumer SSDs typically experience a bursty workload characterized by frequent host idle times that allow the memory system firmware to perform background tasks such as read scans. The read scan management techniques discussed herein allow memory device firmware to effectively execute read scans during host idle events and reduce the impact on host performance.

In the examples discussed herein, the window-based criteria may be applied to time triggers, frequency domain triggers, or event based triggers, to allow deployment in response to synchronous and asynchronous events of the memory device. When the window-based trigger criteria is met, the memory device initiates read scans on the sampled NAND blocks as a background task during the next host idle state. The read scan then may be provided with an opportunity to complete upon occurrence of the idle state, in a preemptive fashion, before a scheduled condition that launches the read scan would otherwise occur.

This preemptive read scan provides an opportunity for the memory device to perform data integrity specific maintenance tasks in the background during host idle time, thus alleviating the host IO performance impact of running in the foreground. As a result, collisions or contentions between host IO accesses and read scans in the foreground may be minimized. Also as a result, the memory device may utilize the identified host idle time to conduct read scans and other background tasks in an optimized or prioritized manner, to provide improved host IO performance and latency for typical usage of mobile devices and consumer SSDs. This approach is complimentary to the various low power requirements found in some mobile devices and consumer SSDs, which often impose aggressive power management policies on memory devices that tend to limit the availability of background idle time.

The techniques discussed herein also may be used to effectively hide latencies caused by read scans in the background host idle time. The techniques also help to minimize read scan related collisions with host IO in the foreground, thus improving performance and reducing latency overheads for memory device read/write operations. Additionally, the techniques provide better performance and latency consistency for benchmark workloads, as well as optimization for typical user workloads that are characterized with frequent host idle times. These and other technical advantages will be apparent from the following example configurations and implementations.

Figure 5:
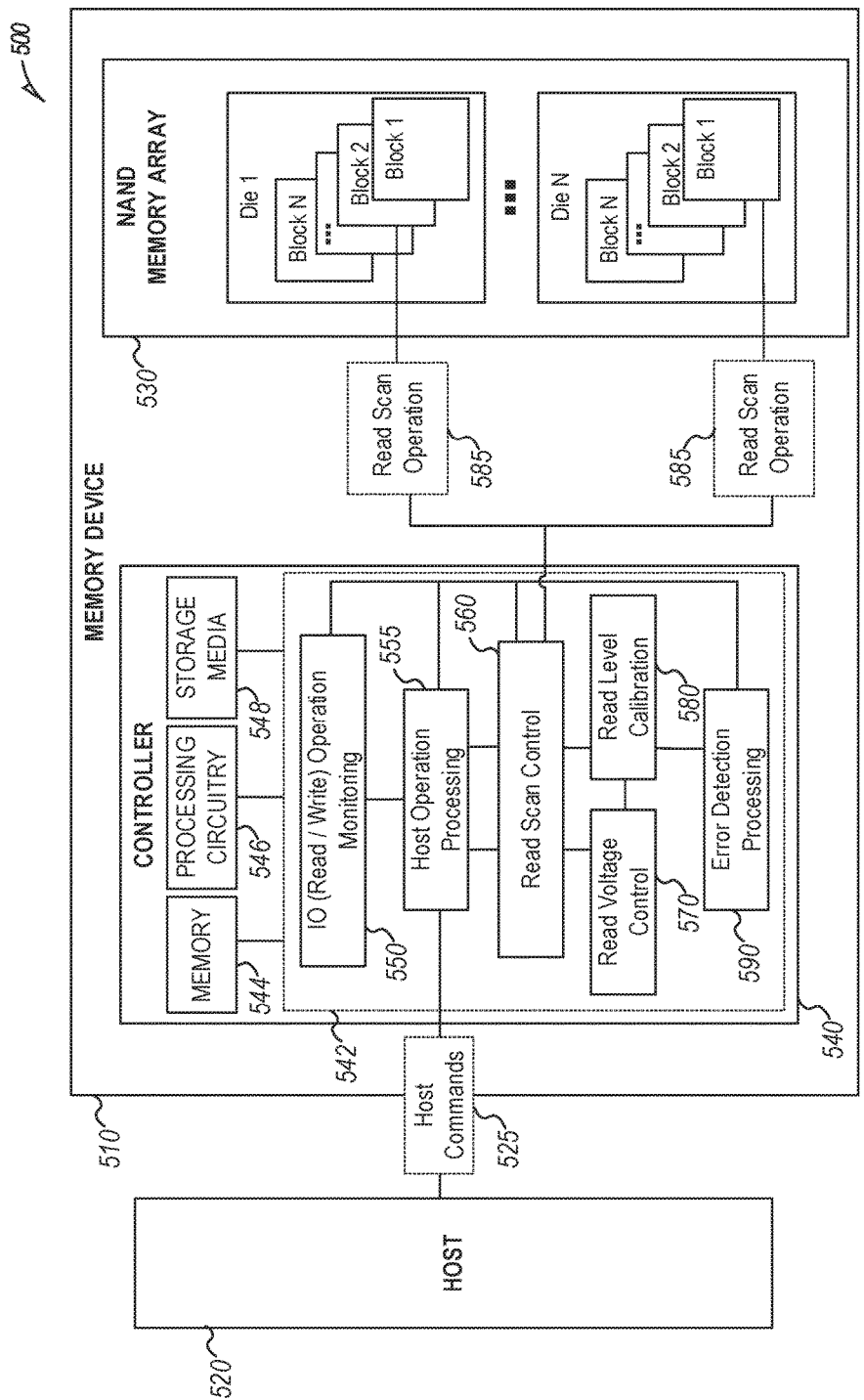
FIG. 5 illustrates a block diagram of an example system including a memory device adapted for implementing preemptive idle time read scan operations.

FIG. 5 provides a block diagram of an example system 500 including a memory device 510 (e.g., a SSD storage device, a SD/MMC card, etc.) having a memory controller 540 with control modules 542 adapted for implementing the read scan optimization techniques discussed herein. In an example, the functionality of the control modules 542 may be implemented in respective modules in a firmware of the memory controller 540. However, it will be understood that various forms of software, firmware, and hardware may be utilized to by the controller 540 to implement the control modules 542 and the other techniques discussed herein.

As shown, the memory device 510 includes a NAND memory array 530 with multiple dies (dies 1-N), with each die including one or more blocks (blocks 1-N). Each of the one or more blocks may include further divided portions, such as one or more word lines (not shown) per block; and each of the one or more word lines may be further comprised of one or more pages (not shown) per word line, depending on the number of data states that the memory cells of that word line are configured to store.

In an example, the blocks of memory cells of the memory array 530 include groups of at least one of: single-level cell (SLC), multi-layer cell (MLC), triple-layer cell (TLC), or quad-layer cell (QLC) NAND memory cells. Also, in an example, the memory array 530 is arranged into a stack of three-dimensional (3D) NAND dies, such that the respective group of multiple blocks hosting a respective block is a member of a group of blocks provided by a respective die in the stack of 3D NAND dies. These configurations and further detailed components of the memory array 530 are not illustrated in FIG. 5 for simplicity. However, the memory array 530 may incorporate these or any of the features described above with reference to features of 3D NAND architecture devices or other forms of NAND storage devices.

The memory device 510 is shown as being operably coupled to a host 520 via a controller 540. The controller 540 is adapted to receive and process host IO commands 525, such as read operations, write operations, erase operations, and the like, to read, write, erase, and manage data stored within the memory array 530. A variety of other components for the memory device 510 (such as a memory manager, and other circuitry or operational components) and the controller 540 are also not depicted for simplicity.

The controller 540 is depicted as including a memory 544 (e.g., volatile memory), processing circuitry 546 (e.g., a microprocessor), and a storage media 548 (e.g., non-volatile memory), used for executing instructions (e.g., instructions hosted by the storage media 548, loaded into memory 544, and executed by the processing circuitry 546) to implement the control modules 542 for management and use of the memory array 530. The functionality provided by the control modules 542 may include, but is not limited to: IO operation monitoring 550 (e.g., to monitor read and write IO operations, originating from host commands); host operation processing 555 (e.g., to interpret and process the host IO commands 525, and to issue further commands to the memory array 530 to perform respective read, write, erase, or other host-initiated operations); read scan control 560 (e.g., to control the timing, criteria, conditions, and parameters of respective read scan operations 585 on the memory array 530); read voltage control 570 (e.g., to establish, set, and utilize a read voltage level to read a particular portion of the memory array 530); read level calibration 580 (e.g., to operate a calibration procedure to identify a new read voltage level of a particular portion or portions of the memory array 530); and error detection processing 590 (e.g., to identify and correct errors from data obtained in read operations, to identify one or more RBER(s) for a particular read operation or set of operations, etc.).

In an example, the host operation processing 555 is used to interpret and process the host IO commands 525 (e.g., read and write commands) and initiate accompanying commands in the controller 540 and the memory array 530 to accomplish the host IO commands 525. Further, in response to the host IO commands 525, and the IO operation monitoring 550, and error detection processing 590, the host operation processing 555 may coordinate timing, conditions, and parameters of the read scan control 560.

In an example, the IO operation monitoring 550 operates to track reads and writes to the memory array initiated by host IO commands. The IO operation monitoring 550 also operates to track accompanying IO operations and states, such as a host IO active or inactive state (e.g., where an active state corresponds to the state of the controller 540 and memory array 530 actively performing read or write IO operations initiated from the host 520, and where an inactive state corresponds to an absence of performing such IO operations initiated from the host 520). The IO operation monitoring 550 may also monitor aspects of voltage level and read error rates occurring with the IO operations initiated from the host 520, in connection with determining parameters for read scan control 560 as discussed herein.

In an example, the read scan control 560 operates to identify parameters in the memory array 530 and controller 540 for scheduling and conducting a read scan operation 585, such as based on the IO conditions (e.g., indicated by the IO operation monitoring 550) or error conditions (e.g., indicated by the error detection processing 590). The read scan control 560 further defines one or more scheduled conditions and one or more trigger windows for scheduling the read scan operation 585 and preemptively launching the read scan operation 585 during the trigger window(s). The read scan control 560 further operates to initiate and perform the read scan operation 585 based on these or other parameters, through synchronous or asynchronous event processing as illustrated and discussed below with reference to FIGS. 6A and 6B.

In an example, the read voltage control 570 is used to establish, change, and provide a voltage value used to read a particular area of memory (such as a respective block in the memory array 530). For example, the read voltage control 570 may implement various positive or negative offsets in order to read respective memory cells and memory locations (e.g., pages, blocks, dies) including the respective memory cells.

In an example, the read level calibration 580 is used to establish (e.g., change, update, reset, etc.) the value of the read voltage implemented by the read voltage control 570. The read level calibration 580 may be implemented through multiple sampling commands performed on the memory array 530, such as sampling commands issued at varying voltages to multiple areas of the memory array, which attempt to determine a read voltage that is optimized to the Vt of those areas. The read level calibration 580 may operate in connection with the features of the host operation processing 555, the read scan control 560, or the error detection processing 590. For instance, the host operation processing 555 may identify memory locations for sampling based on IO read operations to those locations; also for instance, the read scan control 560 may trigger performance of the read level calibration 580 in response to an increasing RBER trend of various read scans; also for instance, the error detection processing 590 may trigger the read level calibration 580 in response to particular conditions of errors or an error rate of read data (e.g., in data read from a block) as exceeding a particular threshold.

In an example, the error detection processing 590 may detect a recoverable error condition (e.g., a RBER value or an RBER trend), an unrecoverable error condition, or other measurements or error conditions for a memory cell, a group of cells, or larger areas of the memory array (e.g., averages or samples from a block, group of blocks, die, group of dies, etc.). Also in an example, the error detection processing 590 may operate to trigger an event or condition of a read scan via the read scan control 560, or to trigger or schedule a calibration operation with the read level calibration 580.

As discussed herein, the read scan control 560 may involve aspects of scheduling and coordinating a read scan operation 585 to occur at or in response to a scheduled condition (e.g., at a determined time, in response to a particular event or occurrence), identifying a trigger window for preemptive triggering of the read scan operation, and initiating the read scan operation preemptively before the scheduled condition during an idle state in the trigger window. When triggered, the read scan operation may include performing reads of sets of sampled pages or word lines of a plurality of blocks of the memory array 530; the read scan operation also may perform such reads with different read voltages among the plurality of blocks of the memory array 530. In an example, the read scan control 560 operates to select the plurality of blocks at random from within the memory array 530 (e.g., with random sampling); in another example, the read scan control 560 operates to select specific plurality of blocks based on: frequency or recency of access, age of data retention, or an error rate (e.g., RBER) of read operations at a particular location, such as based upon locations of read operations as tracked by the IO operation monitoring 550.

Additionally, the sampling and read operations that are performed in a read scan by the read scan control 560 may allow configuration, such as from a specification (e.g., a determined setting or calculation) of: a size of data (e.g., data corresponding to a page, block, group of blocks, die) that is sampled; a number of pages in total that are sampled; a number of pages within a block that are sampled; whether certain cells, pages, blocks, dies, or certain types of such cells, pages, blocks, dies are or are not sampled; and the like. Likewise, the sampling that is performed in a read scan by the read scan control 560 may be adjusted according to certain benchmarks, user patterns, read access patterns, or other characteristics to match the real-world actual or expected usage of the storage device.

In addition to the techniques discussed herein, other aspects of maintenance operations may be implemented by the control operations 542 in the controller 540. Such operations may include garbage collection or reclamation, wear leveling, block management, and other forms of background activities performed upon the memory array 530. Such background activities may be triggered during an idle state detected by the IO operation monitoring 550, such as immediately following or concurrently with a read scan operation.

Figure 6A:
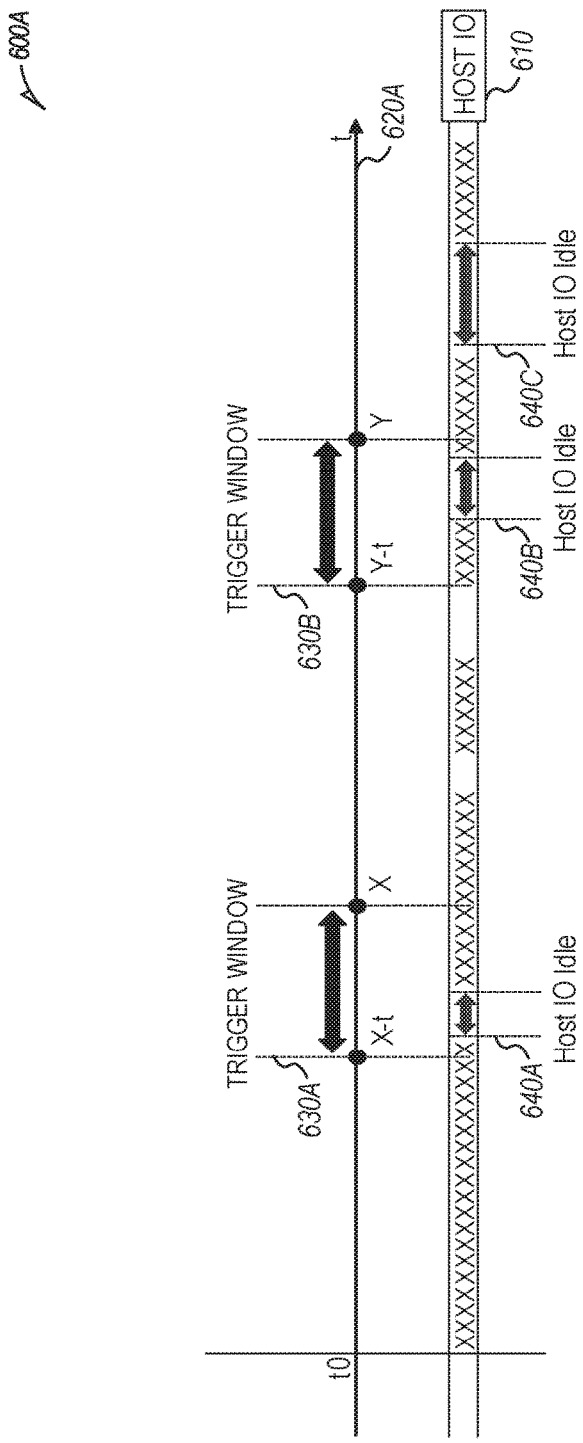
FIG. 6A illustrates a timeline of an example read scan trigger criteria implementing time-based condition triggers for preemptive idle time read scan operations in a memory device.

FIG. 6A illustrates a timeline scenario 600A of an example read scan trigger criteria implementing time-based condition triggers for preemptive idle time read scan operations in a memory device. Specifically, the timeline scenario 600A illustrates an event timeline 620A occurring from t0 to t as contrasted with an IO operation timeline 610 illustrating read and write operations occurring from host IO.

As shown, event timeline 620 includes various scheduled triggers for a read scan operation based on synchronous activity, including scheduled condition X (to occur at time X) and scheduled condition Y (to occur at time Y). For instance, a read scan operation may be scheduled at a regular interval to occur every Y-X minutes (e.g., every n seconds, minutes, hours, days, etc.). In the depiction of the timeline scenario 600A, the event timeline 620A may operate to ensure that a respective read scan operation is commenced at no later than scheduled time X and scheduled time Y, meaning that the respective read scan operation can begin earlier than time X and time Y within a trigger window.

The IO operation timeline 610, in contrast, includes bursts of host IO activity that is unlikely to occur according to a defined schedule. As shown, the IO operation timeline 610 includes a number of IO operations (designated by respective "X" characters), in addition to periods of time in which the IO operations are not being conducted (designated by white space). The periods of time in which the IO operations are not being conducted include periods 640A, 640B, 640C, indicating an idle state for host IO operations. It will be understood that the periods 640A, 640B, 640C and the timelines 610, 620A are provided with a simplified representation for illustrative purposes, as other memory device operations are not illustrated in the timeline scenario 600A for purposes of simplicity.

The event timeline 620A further depicts respective preemptive trigger windows 630A, 630B, which are used to designate a preemptive period of time to perform read scan operations. Specifically, the trigger window 630A starts at time X-t and continues until time X; the trigger window 630B starts at time Y-t and continues until time Y. The memory device may monitor for a respective idle state of host IO operations, with the idle state used to initiate and conduct read scan operations within the idle states occurring within the trigger windows 630A, 630B.

The timeline scenario 600A provides an implementation of preemptive synchronized read scans that are pre-scheduled based on a time interval or other times. For example, when synchronized read scans are utilized, an absolute trigger limit for a read scan may be set to every N time-units (e.g., seconds, minutes, hours, or days), and the window-based criterion for the lower trigger limit is N-t time-units, where t can be a configurable parameter. In this scenario, a preemptive read scan may be triggered in the background every N-t time-units, if the host IO is idle; else, the preemptive read scan is triggered at N time-units in the foreground. In contrast, with an absolute trigger-based approach, the read scan is triggered only at X (even when the host IO is active).

As a first example, within trigger window 630A (starting at time X-t), the host IO activity continues until the first idle period 640A. In response to the host IO becoming idle and the memory device entering a corresponding idle state, a preemptive read scan operation may commence. Specifically, the read scan operation, which was otherwise scheduled to occur at time X (the originally scheduled condition), will now begin during the first idle period 640A. In the event that the preemptive read scan operation cannot complete in the background within the first idle period 640A because host IO activity occurs, the preemptive read scan operation may be delayed or may continue. In an example, the preemptive read scan operation may pause until resuming at time X. In another example, the preemptive read scan operation may continue at a lower priority than host IO operations when the host IO activity resumes, but then become prioritized at time X to ensure that the read scan completes.

As a second example, within trigger window 630B (starting at time Y-t), the host IO activity continues until the second idle period 640B. In response to the host IO becoming idle and the memory device entering a corresponding idle state, another preemptive read scan operation may commence. Specifically, this read scan operation, which was otherwise scheduled to occur at time Y, will now begin during the second idle period 640B. Similar to the example above, the event that the preemptive read scan operation cannot complete within the second idle period 640B (e.g., because host IO activity occurs), the preemptive read scan operation may be delayed or may continue. In a further example, when interrupted by host IO activity, the preemptive read scan operation may be delayed until another host idle time occurs (e.g., at the third idle period 640C); in another example, the preemptive read scan operation may be delayed no longer than time Y.

Figure 6B:
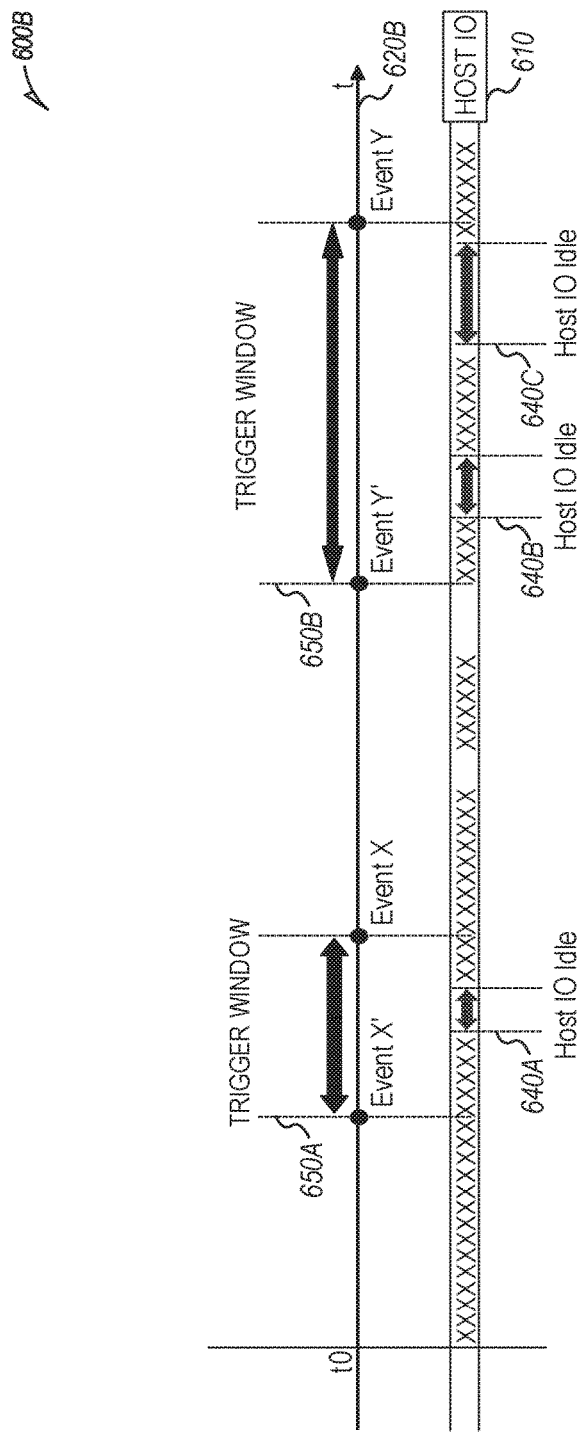
FIG. 6B illustrates a timeline of an example read scan trigger criteria implementing event-based condition triggers for preemptive idle time read scan operations in a memory device.

FIG. 6B illustrates a timeline scenario 600B of an example read scan trigger criteria implementing event-based condition triggers for preemptive idle time read scan operations in a memory device. In a similar fashion to timeline scenario 600A, the timeline scenario 600B illustrates an event timeline 620B occurring from t0 to t as contrasted with an IO operation timeline 610 illustrating read and write operations occurring from host IO. However, the event timeline 620B includes scheduled conditions that result from event or occurrence triggers (e.g., asynchronous activity) rather than from predetermined times.

As shown, event timeline 620B includes various scheduled triggers for a read scan operation based on asynchronous activity, including scheduled condition X (e.g., to occur as a result of a particular event or occurrence) and scheduled condition Y (to occur as a result of a particular event or occurrence). For instance, a read scan operation may be scheduled to occur when a frequency of errors (e.g., error handling trigger events in a block) exceeds a certain rate or amount, when an event count exceeds a determined threshold, or when a particular attribute (e.g., of the memory array, the memory controller, or one or more modules in a firmware of the memory controller) is detected. In the operation of the timeline scenario 600B, the event timeline 620B may operate to ensure that a respective read scan operation is commenced at no later than scheduled condition X and scheduled condition Y, meaning, the read scan operation can be commenced earlier than scheduled event X and scheduled event Y within a trigger window.

Again in contrast, the IO operation timeline 610, includes bursts of host IO activity that is unlikely to occur according to a defined schedule. As shown, the IO operation timeline 610 includes a number of IO operations, and periods of time in which the IO operations are not being conducted (periods 640A, 640B, 640C). The event timeline 620B further depicts the asynchronous nature of the events, and the varying sizes of the trigger windows 650A, 650B, which are used to designate a preemptive period of time to perform read scan operations. Specifically, the trigger window 650A starts at the occurrence of event X' and continues to the occurrence of event X; the trigger window 650B starts at the occurrence of event Y' and continues to the occurrence of event Y. Notably, the trigger window 650A is smaller than the trigger window 650B, due to the asynchronous nature of the events occurring in the memory device and the host IO. However, the memory device may continue to monitor for a respective idle state that is used to perform read scan operations within the trigger windows 650A, 650B.

The timeline scenario 600B provides an implementation of preemptive asynchronous read scans used to address read disturb, such as where a trigger event is based on a block read count threshold. For example, a window-based read count threshold criterion can be set for the trigger window, such that once a lower limit (event X') for the threshold is met, the storage device can schedule the read scan to pre-emptively occur when the host IO encounters an idle event (before event X). Additionally, in a further example, the window trigger criterion can be modulated in response to certain event triggers such as an extent of error handling (e.g., a number of steps in an error handling flow). Based on the number of steps in the error handling flow required to recover errors or the error handling trigger rate, the system can modulate time-based or block usage-based read scan criteria to adapt to the changing media characteristics.

As a first example, within trigger window 650A (starting at the occurrence of event X'), the host IO activity continues until the first idle period 640A. In response to the host IO becoming idle and the memory device entering a corresponding idle state, the preemptive read scan operation may commence. Specifically, the read scan operation, which was otherwise scheduled to occur at (or after) the occurrence of event X, will now begin during the first idle period 640A. In the event that the read scan operation cannot complete in the background within the first idle period 640A because host IO activity occurs, the read scan operation may be delayed or may continue (e.g., as discussed above with reference to timeline scenario 600A).

As a second example, within trigger window 650B (starting at the occurrence of event Y'), the host IO activity continues until the second idle period 640B. In response to the host IO becoming idle and the memory device entering a corresponding idle state, another preemptive read scan operation may commence. Specifically, this read scan operation, which was otherwise scheduled to occur at or after the occurrence of event Y, will now begin during the second idle period 640B. Notably, the trigger window 650B is indicated as being a different size than trigger window 650A, due to the asynchronous nature of the events. Thus, as shown, an additional host idle period (third idle period 640C) may occur within the trigger window 650B. The third idle period 640C may be used to launch additional background operations, to complete read scan operations, or to perform additional scheduled and coordinated idle time tasks.

In contrast to the techniques illustrated in FIGS. 6A and 6B, conventional approaches typically utilize a single, absolute criterion for time, frequency, or other metrics to trigger a read scan operation. Thus, conventional approaches are not optimized to perform read scans during the background host idle time and may result in higher collision rate with host IO. In particular, read scan triggers often occur in the foreground, which causes a storage device to multiplex read scan operations along with the host IO traffic, thus impacting performance of both types of operations. Collisions also result in an increased latency to service the host IO commands. These concerns are addressed with the approaches discussed herein, which provide flexibility and optimization to preemptively schedule and launch read scans, and as applicable, delay and coordinate such read scans.

Figure 7:
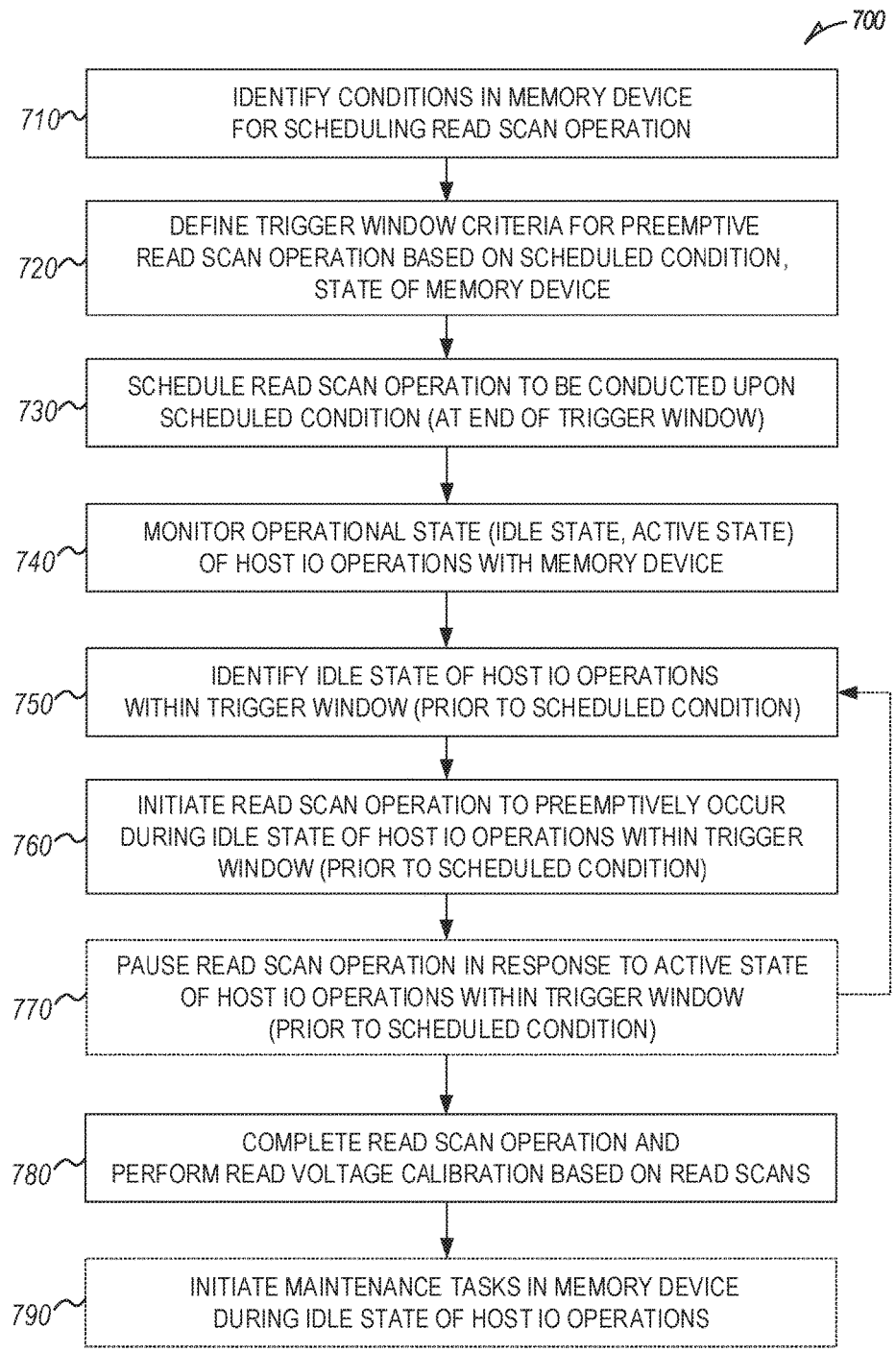
FIG. 7 illustrates a flowchart of an example set of operations adapted for performing preemptive idle time read scan operations in a memory device.

FIG. 7 illustrates a flowchart 700 of an example set of operations adapted for performing preemptive idle time read scan operations in a memory device. In an example, the operations of the flowchart 700 may be implemented by a controller (e.g., controller 115, 540) of a storage device, through a combination of executed operations in software, firmware, or configured hardware. However, some or all aspects of the following techniques may be implemented by other components (e.g., as initiated by a host) in connection with other commands, controls, and forms of orchestration.

In an example, the operations of the flowchart 700 may be implemented in a memory device, the memory device comprising a NAND memory array having groups of multiple blocks of memory cells, and a memory controller operably coupled to the memory array, with the memory controller adapted (e.g., configured, arranged, programmed) to perform the respective operations. In another example, the operations of the flowchart 700 may be implemented in a method performed by or on a memory controller (or with modules of the memory controller) that controls a NAND memory array, the memory array having groups of multiple blocks of memory cells. In an example, the operations of the flowchart 700 may be implemented in a device readable storage medium, which provides instructions to perform the respective operations when executed (e.g., when executed by a controller of a memory device).

The flowchart 700 is shown as commencing with the identification of conditions in a memory device for scheduling a read scan operation (operation 710). These conditions may include the establishment of a scheduled time condition for a read scan (e.g., such that a read scan must be performed or attempted every n intervals of time), the establishment of a scheduled frequency or evaluative condition (e.g., such that a read scan must be performed in response to n reads occurring, or in response to an error rate exceeding m), or the establishment of an event-based condition (e.g., such that a read scan must be performed in response to certain detected conditions such as events or attributes within the memory device).

The definition of the read scan scheduling is accompanied by the definition of a trigger window for a preemptive read scan operation (operation 720). For example, the definition of a trigger window may be based on a variation of the scheduled event, conditions in the memory device, or a time-based window, which precedes the scheduled condition. In connection with the definition of the trigger window, a read scan operation is scheduled to occur upon occurrence of the scheduled condition (operation 730), which is coordinated with the end of the defined trigger window. The scheduled condition may be time, frequency, or event based, as discussed in the asynchronous and synchronous examples herein.

As discussed herein, the read scan operation may be defined to sample data at multiple locations of the memory array by performing reads at the multiple locations. In further examples, the read scan operation may include tracking of error rates, error rate trends, and other conditions based on the results of the read scans among the multiple locations. For instance, the read scan operation may include performing reads of sets of sampled pages or word lines of a plurality of blocks of the memory array, such that the reads are performed with different read voltages among the plurality of blocks. In still further examples, the plurality of blocks are selected at random from within the NAND memory array.

The flowchart 700 continues with the monitoring of the operational state of host IO operations with the memory device (operation 740). In an example, this may include monitoring the operational state of the memory device to identify an active state corresponding to the performance of operations initiated from a host, or an idle state corresponding to an absence of operations initiated from the host. Based on this monitoring, an idle state of the host IO operations may be identified and detected within the defined trigger window, prior to the scheduled condition (operation 750).

In response to the operational state of the memory device entering the idle state during the trigger window, the read scan operation may be preemptively initiated (operation 760). Thus, during the idle state of host IO operations within the trigger window, the read scan operation may preemptively occur before the scheduled condition.

The flowchart 700 continues with an optional condition to pause a read scan operation that is not complete (operation 770). The pausing of a read scan operation may occur within a trigger window, prior to the scheduled condition, such as when the idle state transitions into an active state of host IO operations. With this optional condition, the flowchart 700 resumes to await an identification of the idle state of host IO operations (operation 750), and initiate the read scan operation upon the occurrence of the idle state within the trigger window (operation 760).

The flowchart 700 concludes with the completion of the read scan operation, and the performance of any additional operation(s) such as read voltage calibration based on the read scans (operation 780). If the read scan operations have not completed during the idle state(s) by the scheduled event (e.g., as paused by operation 770), the read scan operations may be completed upon occurrence of the scheduled condition.

Finally, in an optional example, where the memory device remains in an idle state, additional maintenance tasks such as garbage collection or reclamation, wear leveling, block retirement, and the like may be initiated on the memory device (operation 790). Specifically, pre-emptive read scans may be one of several background tasks performed by the memory device during the host idle state. In a further example, a background module of the memory device governs the priority and scheduling aspects of the maintenance tasks. For instance, read scans may be pre-emptively triggered during host idle time based on the trigger window, but will not necessarily take a higher priority over other background tasks managed by the background module. Accordingly, coordination and scheduling may be performed by the background module to allow the maintenance tasks to be conducted before, after, concurrently, or in compliment with the read scan operations.

In response to the operational state of the memory array not entering the idle state during the trigger window, the read scan operation may be initiated to occur no later than the scheduled event. For instance, consider a scenario where a second read scan operation is scheduled to be conducted upon occurrence of a second scheduled condition. The second read scan may be initiated in response to the operational state of the memory not entering the idle state before the second scheduled condition, such that the second read scan operation is initiated to occur in response to the second scheduled condition (e.g., without preemptive scheduling). Thus, if preemptive scheduling is unsuccessful or cannot be utilized as a background operation within a trigger window, the read scan operation may still be initiated within the foreground.

It will be understood that these and the other example implementations discussed above are provided as examples, and may be accompanied by other time and operational optimizations to maximize efficiency and use of idle time. Further, the techniques for sampling and triggering the voltage calibration may modified to be integrated with use of existing read scan triggers, conditions, and operations, providing a minimal or even zero impact as compared with conventional read scan triggering techniques.

Figure 8:
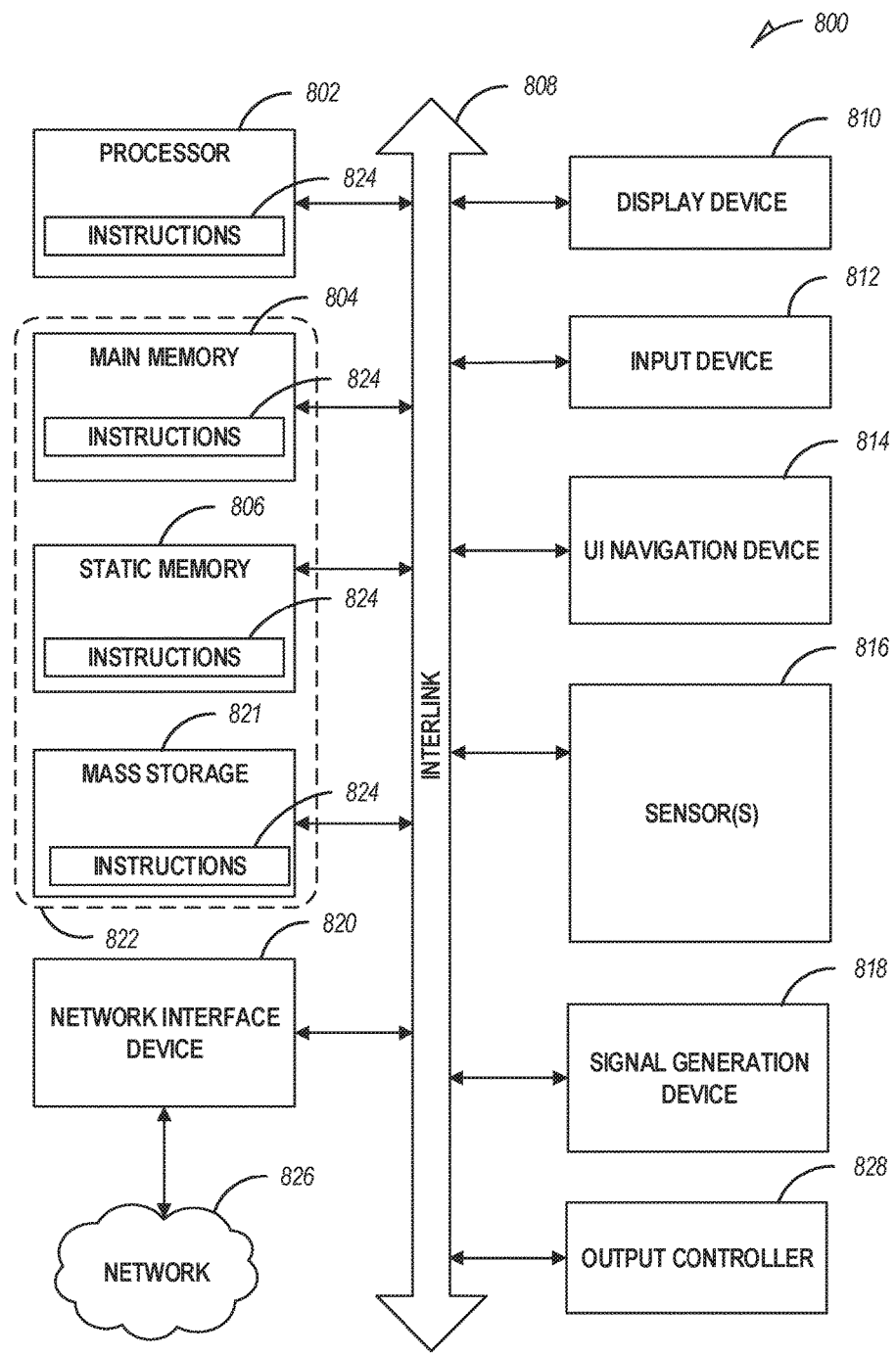
FIG. 8 is a block diagram illustrating an example of a machine upon which one or more embodiments may be implemented.

FIG. 8 illustrates a block diagram of an example machine 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) may include a hardware processor 802 (e.g., a central processing unit (CPU), a graphics processing unit (GPU), a hardware processor core, or any combination thereof, such as the memory controller 115, etc.), a main memory 804 and a static memory 806, some or all of which may communicate with each other via an interlink (e.g., bus) 808. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 816, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute the machine readable medium 822.

While the machine readable medium 822 is illustrated as a single medium, the term "machine readable medium" may include a single medium or multiple media (e.g., a centralized or distributed database, or associated caches and servers) configured to store the one or more instructions 824.

The term "machine readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax™), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Additional examples of the presently described embodiments are suggested according to the structures and techniques described above and specified in the following examples and claims.

Example 1 is a memory device, comprising: a NAND memory array; and a memory controller operably coupled to the memory array, the memory controller to perform operations comprising: scheduling a read scan operation on the memory array to occur upon a scheduled condition, wherein the read scan operation is to sample data at multiple locations of the memory array by performing reads at the multiple locations; monitoring an operational state of the memory array, the operational state of the memory array including an active state corresponding to performing operations initiated from a host, and an idle state corresponding to an absence of operations initiated from the host; and initiating the read scan operation in response to the operational state of the memory array entering the idle state, wherein the read scan operation is initiated to preemptively occur before the scheduled condition.

In Example 2, the subject matter of Example 1 includes, the read scan operation performing reads of sets of sampled pages or word lines of a plurality of blocks of the memory array, wherein the reads are performed with different read voltages among the plurality of blocks.

In Example 3, the subject matter of Example 2 includes, the plurality of blocks being selected at random from within the NAND memory array.

In Example 4, the subject matter of Examples 1-3 includes, scheduling a second read scan operation on the memory array to be conducted upon a second scheduled condition; and initiating the second read scan operation in response to the operational state of the memory array not entering an idle state before the second scheduled condition, wherein the second read scan operation is initiated to occur upon the second scheduled condition.

In Example 5, the subject matter of Examples 1-4 includes, the scheduled condition being a time determined from a scheduled time interval, wherein the initiating of the read scan operation preemptively occurs upon entering the idle state during a predetermined time period prior to the scheduled condition.

In Example 6, the subject matter of Examples 1-5 includes, the scheduled condition being a frequency-based condition, wherein the scheduling of the read scan operation is performed in response to a frequency of error handling trigger events in a block exceeding a determined threshold.

In Example 7, the subject matter of Examples 1-6 includes, the scheduled condition being a predetermined event, wherein the scheduling of the read scan operation is performed in response to the predetermined event occurring within the memory controller, or in response to the predetermined event being identified from an attribute of: the memory array, the memory controller, or one or more modules in a firmware of the memory controller.

In Example 8, the subject matter of Example 7 includes, the predetermined event that occurs within the memory controller corresponding to a block read count exceeding a determined block read count threshold.

In Example 9, the subject matter of Examples 1-8 includes, initiating a wear leveling operation in response to the operational state of the memory array entering the idle state, wherein the wear leveling operation is initiated to occur after completion of the read scan operation.

In Example 10, the subject matter of Examples 1-9 includes, in response to initiating the read scan operation to preemptively occur before the scheduled condition: stopping the read scan operation in response to the operational state of the memory array entering the active state before the scheduled condition; and, in response to re-entering the idle state or in response to occurrence of the scheduled condition, resuming the read scan operation.

In Example 11, the subject matter of Examples 1-10 includes, the operations initiated from the host including read operations or write operations, with the operations further comprising: prioritizing the read scan operation over operations initiated from the host, in response to occurrence of the scheduled condition before a preemptive completion of the read scan operation.

In Example 12, the subject matter of Examples 1-11 includes, initiating read voltage calibration of at least a portion of the memory array in response to data obtained from the reads conducted among the multiple locations of the memory array with the read scan operation.

In Example 13, the subject matter of Example 12 includes, the read scan operation performing sampling of a raw bit error rate (RBER) from the multiple locations in the memory array using multiple read voltages among the multiple locations, wherein the read voltage calibration is performed in response to the RBER exceeding a predetermined threshold.

In Example 14, the subject matter of Examples 1-13 includes, the memory array including at least one of: single-level cell (SLC), multi-layer cell (MLC), triple-layer cell (TLC), or quad-layer cell (QLC) NAND memory cells.

In Example 15, the subject matter of Examples 1-14 includes, the memory array being arranged into a stack of three-dimensional (3D) NAND dies.

Example 16 is a method for performing preemptive read scans in a memory device, the method comprising a plurality of operations performed by a memory controller upon a NAND memory array of the memory device, with the operations comprising: scheduling a read scan operation on the memory array to be conducted upon a scheduled condition, wherein the read scan operation is to sample data at multiple locations of the memory array by performing reads at the multiple locations, and wherein the reads are performed with different read voltages among the multiple locations; monitoring an operational state of the memory array, the operational state of the memory array including an active state corresponding to performing operations initiated from a host, and an idle state corresponding to an absence of operations initiated from the host; and initiating the read scan operation in response to the operational state of the memory array entering the idle state, wherein the read scan operation is initiated to preemptively occur before the scheduled condition.

In Example 17, the subject matter of Example 16 includes, the read scan operation performing reads of sets of sampled pages or word lines of a plurality of blocks of the memory array, wherein the reads are performed with different read voltages among the plurality of blocks.

In Example 18, the subject matter of Example 17 includes, the plurality of blocks being selected at random from within the NAND memory array.

In Example 19, the subject matter of Examples 16-18 includes: scheduling a second read scan operation on the memory array to be conducted upon a second scheduled condition; and initiating the second read scan operation in response to the operational state of the memory array not entering an idle state before the second scheduled condition, wherein the second read scan operation is initiated to occur upon the second scheduled condition.

In Example 20, the subject matter of Examples 16-19 includes, the scheduled condition being a time determined from a scheduled time interval, wherein the initiating of the read scan operation preemptively occurs upon entering the idle state during a predetermined time period prior to the scheduled condition.

In Example 21, the subject matter of Examples 16-20 includes, the scheduled condition being a frequency-based condition, wherein the scheduling of the read scan operation is performed in response to a frequency of error handling trigger events in a block exceeding a determined threshold.

In Example 22, the subject matter of Examples 16-21 includes, the scheduled condition being a predetermined event, wherein the scheduling of the read scan operation is performed in response to the predetermined event occurring within the memory controller, or in response to the predetermined event being identified from an attribute of: the memory array, the memory controller, or one or more modules in a firmware of the memory controller.

In Example 23, the subject matter of Example 22 includes, the predetermined event occurring within the memory controller corresponding to a block read count exceeding a determined block read count threshold.

In Example 24, the subject matter of Examples 16-23 includes: initiating a wear leveling operation in response to the operational state of the memory array entering the idle state, wherein the wear leveling operation is initiated to occur after completion of the read scan operation.

In Example 25, the subject matter of Examples 16-24 includes, in response to initiating the read scan operation to preemptively occur before the scheduled condition, stopping the read scan operation in response to the operational state of the memory array entering the active state before the scheduled condition; and in response to re-entering the idle state or in response to occurrence of the scheduled condition, resuming the read scan operation.

In Example 26, the subject matter of Examples 16-25 includes, the operations initiated from the host including read operations or write operations, with the operations further comprising: prioritizing the read scan operation over operations initiated from the host, in response to occurrence of the scheduled condition before a preemptive completion of the read scan operation.

In Example 27, the subject matter of Examples 16-26 includes, initiating read voltage calibration of at least a portion of the memory array, in response to data obtained from the reads conducted among the multiple locations of the memory array with the read scan operation.

In Example 28, the subject matter of Example 27 includes, the read scan operation performing sampling of a raw bit error rate (RBER) from the multiple locations in the memory array using multiple read voltages among the multiple locations, wherein the read voltage calibration is performed in response to the RBER exceeding a predetermined threshold.

In Example 29, the subject matter of Examples 16-28 includes, wherein the memory array includes at least one of: single-level cell (SLC), multi-layer cell (MLC), triple-layer cell (TLC), or quad-layer cell (QLC) NAND memory cells.

In Example 30, the subject matter of Examples 16-29 includes, wherein the memory array is arranged into a stack of three-dimensional (3D) NAND dies.

Example 31 is a device readable storage medium, that provides instructions that, when executed by a controller of a memory device, performs preemptive read scans on a NAND memory array of the memory device, wherein the instructions cause the controller to perform operations according to any of the techniques of Examples 1-30.

Example 32 is an apparatus comprising respective means for performing any of the methods or techniques of Examples 1-30.

Example 33 is a system, apparatus, or device to perform the operations of any of Examples 1-30.

Example 34 is a tangible machine readable medium embodying instructions to perform or implement the operations of any of Examples 1-30.

Example 35 is a method to perform the operations of any of Examples 1-30.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device, comprising:
   a NAND memory array; and
   a memory controller operably coupled to the memory array, the memory controller to perform operations comprising:
      scheduling a read scan operation on the memory array to occur upon a scheduled condition, wherein the read scan operation is to sample data at multiple locations of the memory array by performing reads at the multiple locations;
      monitoring an operational state of the memory array, the operational state of the memory array including an active state corresponding to performing operations initiated from a host, and an idle state corresponding to an absence of operations initiated from the host; and
      initiating the read scan operation in response to the operational state of the memory array entering the idle state, wherein the read scan operation is initiated to preemptively occur before the scheduled condition.

2. The memory device of claim 1, wherein the read scan operation includes performing reads of sets of sampled pages or word lines of a plurality of blocks of the memory array, and wherein the reads are performed with different read voltages among the plurality of blocks.

3. The memory device of claim 2, wherein the plurality of blocks are selected at random from within the NAND memory array.

4. The memory device of claim 1, the operations further comprising:
   scheduling a second read scan operation on the memory array to be conducted upon a second scheduled condition; and
   initiating the second read scan operation in response to the operational state of the memory array not entering an idle state before the second scheduled condition, wherein the second read scan operation is initiated to occur upon the second scheduled condition.

5. The memory device of claim 1, wherein the scheduled condition is a time determined from a scheduled time interval, and wherein the initiating of the read scan operation preemptively occurs upon entering the idle state during a predetermined time period prior to the scheduled condition.

6. The memory device of claim 1, wherein the scheduled condition is a frequency-based condition, and wherein the scheduling of the read scan operation is performed in response to a frequency of error handling trigger events in a block exceeding a determined threshold.

7. The memory device of claim 1, wherein the scheduled condition is a predetermined event, and wherein the scheduling of the read scan operation is performed in response to the predetermined event occurring within the memory controller, or in response to the predetermined event being identified from an attribute of: the memory array, the memory controller, or one or more modules in a firmware of the memory controller.

8. The memory device of claim 7, wherein the predetermined event occurring within the memory controller corresponds to a block read count exceeding a determined block read count threshold.

9. The memory device of claim 1, the operations further comprising:
   initiating a wear leveling operation in response to the operational state of the memory array entering the idle state, wherein the wear leveling operation is initiated to occur after completion of the read scan operation.

10. The memory device of claim 1, wherein in response to initiating the read scan operation to preemptively occur before the scheduled condition, the operations further comprise:
stopping the read scan operation in response to the operational state of the memory array entering the active state before the scheduled condition; and
resuming the read scan operation, in response to re-entering the idle state or in response to occurrence of the scheduled condition.

11. The memory device of claim 1, wherein the operations initiated from the host include read operations or write operations, with the operations further comprising:
prioritizing the read scan operation over operations initiated from the host, in response to occurrence of the scheduled condition before a preemptive completion of the read scan operation.

12. The memory device of claim 1, the operations further comprising:
initiating read voltage calibration of at least a portion of the memory array in response to data obtained from the reads conducted among the multiple locations of the memory array with the read scan operation.

13. The memory device of claim 12, wherein the read scan operation performs sampling of a raw bit error rate (RBER) from the multiple locations in the memory array using multiple read voltages among the multiple locations, and wherein the read voltage calibration is performed in response to the RBER exceeding a predetermined threshold.

14. The memory device of claim 1, wherein the memory array includes at least one of: single-level cell (SLC), multi-layer cell (MLC), triple-layer cell (TLC), or quad-layer cell (QLC) NAND memory cells.

15. The memory device of claim 1, wherein the memory array is arranged into a stack of three-dimensional (3D) NAND dies.

16. A method for performing preemptive read scans in a memory device, the method comprising a plurality of operations performed by a memory controller upon a NAND memory array of the memory device, with the operations comprising:
scheduling a read scan operation on the memory array to be conducted upon a scheduled condition, wherein the read scan operation is to sample data at multiple locations of the memory array by performing reads at the multiple locations, and wherein the reads are performed with different read voltages among the multiple locations;
monitoring an operational state of the memory array, the operational state of the memory array including an active state corresponding to performing operations initiated from a host, and an idle state corresponding to an absence of operations initiated from the host; and
initiating the read scan operation in response to the operational state of the memory array entering the idle state, wherein the read scan operation is initiated to preemptively occur before the scheduled condition.

17. The method of claim 16, wherein the read scan operation includes performing reads of sets of sampled pages or word lines of a plurality of blocks of the memory array, and wherein the plurality of blocks are selected at random from within the NAND memory array.

18. The method of claim 16, wherein the scheduled condition is a time determined from a scheduled time interval, and wherein the initiating of the read scan operation preemptively occurs upon entering the idle state during a predetermined time period prior to the scheduled condition.

19. The method of claim 16, wherein the scheduling of the read scan operation is performed in response to: a frequency of error handling trigger events in a block exceeding a determined threshold, an event occurring within the memory controller, or an event being identified from an attribute of: the memory array, the memory controller, or one or more modules in a firmware of the memory controller.

20. The method of claim 16, wherein in response to initiating the read scan operation to preemptively occur before the scheduled condition, the operations further comprise:
stopping the read scan operation in response to the operational state of the memory array entering the active state before the scheduled condition; and
resuming the read scan operation, in response to re-entering the idle state or in response to occurrence of the scheduled condition.

21. The method of claim 16, wherein the operations initiated from the host include read operations or write operations, with the operations further comprising:
prioritizing the read scan operation over operations initiated from the host, in response to occurrence of the scheduled condition before a preemptive completion of the read scan operation.

22. The method of claim 16, the operations further comprising:
initiating read voltage calibration of at least a portion of the memory array in response to data obtained from the reads conducted among the multiple locations of the memory array with the read scan operation.

23. The method of claim 22, wherein the read scan operation performs sampling of a raw bit error rate (RBER) from the multiple locations in the memory array using multiple read voltages among the multiple locations, and wherein the read voltage calibration is performed in response to the RBER exceeding a predetermined threshold.

24. A device readable storage medium, that provides instructions that, when executed by a memory controller of a memory device, perform preemptive read scans on a NAND memory array of the memory device, wherein the instructions cause the controller to perform operations comprising:
scheduling a read scan operation on the memory array to be conducted at a scheduled condition, wherein the read scan operation is to sample data at multiple locations of the memory array by performing reads at the multiple locations, and wherein the reads are performed with different read voltages among the multiple locations;
monitoring an operational state of the memory array, the operational state of the memory array including an active state corresponding to performing operations initiated from a host, and an idle state corresponding to an absence of operations initiated from the host; and
initiating the read scan operation in response to the operational state of the memory array entering the idle state, wherein the read scan operation is initiated to preemptively occur before the scheduled condition.

25. The device readable storage medium of claim 24, wherein the read scan operation includes performing reads of sets of sampled pages or word lines of a plurality of blocks of the memory array, and wherein the plurality of blocks are selected at random from within the memory array.

26. The device readable storage medium of claim 24, wherein the scheduled condition is a time determined from a scheduled time interval, and wherein the initiating of the read scan operation preemptively occurs upon entering the idle state during a predetermined time period prior to the scheduled condition.

27. The device readable storage medium of claim 24, wherein the scheduling of the read scan operation is performed in response to: a frequency of error handling trigger events in a block exceeding a determined threshold, an event occurring within the memory controller, or an event being identified from an attribute of: the memory array, the memory controller, or one or more modules in a firmware of the memory controller.

28. The device readable storage medium of claim 24, wherein in response to initiating the read scan operation to preemptively occur before the scheduled condition, the operations further comprise:
   stopping the read scan operation in response to the operational state of the memory array entering the active state before the scheduled condition; and
   resuming the read scan operation, in response to re-entering the idle state or in response to occurrence of the scheduled condition.

29. The device readable storage medium of claim 24, wherein the operations initiated from the host include read operations or write operations, with the operations further comprising:
   prioritizing the read scan operation over operations initiated from the host, in response to occurrence of the scheduled condition before a preemptive completion of the read scan operation.

30. The device readable storage medium of claim 29, the operations further comprising:
   initiating read voltage calibration of at least a portion of the memory array in response to data obtained from the reads conducted among the multiple locations of the memory array with the read scan operation.

31. The device readable storage medium of claim 30, wherein the read scan operation performs sampling of a raw bit error rate (RBER) from the multiple locations in the memory array using multiple read voltages among the multiple locations, and wherein the read voltage calibration is performed in response to the RBER exceeding a predetermined threshold.

* * * * *